United States Patent [19]
Hull et al.

[11] Patent Number: 5,815,445
[45] Date of Patent: Sep. 29, 1998

[54] VOLTAGE REGULATOR FOR CLAMPING A ROW VOLTAGE OF A MEMORY CELL

[75] Inventors: Richard L. Hull, Chandler; Randy L. Yach, Phoenix, both of Ariz.

[73] Assignee: Microchip Technology Incorporated, Chandler, Ariz.

[21] Appl. No.: 866,359

[22] Filed: May 30, 1997

[51] Int. Cl.⁶ .................................................. G11C 7/00
[52] U.S. Cl. ........................ 365/189.06; 365/185.23; 365/189.11; 365/230.06
[58] Field of Search .................... 365/189.06, 189.11, 365/185.23, 185.24, 230.06

[56] References Cited

U.S. PATENT DOCUMENTS

| | | | |
|---|---|---|---|
| 5,287,307 | 2/1994 | Fukuda et al. ................... | 365/189.06 |
| 5,333,122 | 7/1994 | Ninomiya ........................... | 365/189.06 |
| 5,654,921 | 8/1997 | Sano ................................... | 365/185.24 |

*Primary Examiner*—Son T. Dinh
*Attorney, Agent, or Firm*—Harry M. Weiss; Jeffrey D. Moy; Harry M. Weiss & Associates, P.C.

[57] ABSTRACT

A voltage regulator which will clamp the row voltage of a memory cell or array. The voltage regulator will clamp to a value which is greater than the erased threshold voltage of the memory cell and less than the worst case programmed threshold voltage of the memory cell. The voltage regulator uses an unprogrammed memory cell of the memory array for allowing the row voltage outputted by the voltage regulator to be self-tracking over manufacturing process variations and ambient environmental influences. A switching circuit is coupled to the unprogrammed memory cell for clamping the row voltage outputted by said voltage regulator below the programmed threshold voltage level.

19 Claims, 1 Drawing Sheet

VOLTAGE REGULATOR FOR CLAMPING A ROW VOLTAGE OF A MEMORY CELL

RELATED APPLICATIONS

This application is related to pending U.S. patent applications entitled "VOLTAGE REFERENCE GENERATOR FOR EPROM MEMORY ARRAY," Ser. No. 08/723,924 filed on Oct. 1, 1996, and "OVERCHARGE/DISCHARGE VOLTAGE REGULATOR FOR EPROM MEMORY ARRAY," Ser. No. 8/723,926 filed on Oct. 1, 1996, both in the name of the same inventors, and assigned to the same assignee as this Application. The disclosures of the above referenced applications are hereby incorporated by reference into this application.

BACKGROUND OF THE INVENTION

1. Field of the Invention

This invention relates generally to memory arrays and, more specifically, to a voltage regulator for clamping a voltage of a memory cell of a memory array to a value which is greater than an erased threshold voltage of the memory cell and less than a worst case programmed threshold voltage of the memory cell.

2. Description of the Prior Art

Memory devices are fabricated using semiconductor process technology. As line widths are reduced in progression of the process technology, it may be desirable not only to design and fabricate entirely new versions of the products, but to "shrink" or scale existing products to smaller sizes with the new technology. This requires a review and analysis of the design and architecture of the product and the manner in which the attempted scaling of its size may adversely affect its operation.

In general, in order to read the data of a memory cell in a memory array, a measurement of the programmed threshold voltage of the memory element is required. The memory cell is said to be erased if the threshold voltage of the memory cell is low, and to programmed if the threshold voltage is high. The cell is read by applying a voltage to the control gate of a transistor comprising the memory cell. If the applied voltage is higher than the threshold voltage, current flows through the memory cell. The programming margin of the memory cell is the voltage difference between the maximum applied control gate voltage and the programmed threshold voltage of the programmed memory cell. A programmed memory cell will not conduct current when read by application of a control gate voltage of a lower magnitude than the high threshold voltage of the memory cell.

In most implementations, the control gate voltage used to read the memory array is the supply voltage of the system. If the programmed threshold voltage of the memory cell is lower than the maximum value of the supply voltage, a programmed memory cell cannot be detected using the classic technique.

Scaling memory devices to smaller sizes has the effect of reducing the voltage range at which the memory devices operate. When a memory device is shrunk, the programmed threshold voltage of the memory cell is decreased and the effective programming margin is lowered. Furthermore, a smaller memory cell typically dictates a lower read current. The present invention arose from the necessity to scale a memory device (Erasable Programmable Read Only Memory (EPROM) semiconductor device) to a small geometry manufacturing process. The operating voltage for the semiconductor device being produced on the new manufacturing process is greater than the programming margin of a programmed memory cell of the memory device.

Therefore a need existed to provide a voltage regulator for use with a memory array. The voltage regulator would be used with a row driver circuit to allow a memory cell in the memory array to be read correctly even if the supply voltage $V_{DD}$ to the memory device may be at a level above the programmed margin of the memory cell. The voltage regulator must be able to clamp the row voltage of a memory array at a value which is greater than an unprogrammed threshold voltage level of the memory cell and less than a programmed threshold voltage level of the memory cell.

SUMMARY OF THE INVENTION

In accordance with one embodiment of the present invention, it is an object of the present invention to provide a voltage regulator for use with a memory array.

It is another object of the present invention to provide a voltage regulator that is used with a row driver circuit to allow a memory cell in the memory array to be read correctly even if the supply voltage $V_{DD}$ to the memory device may be at a level above the programmed margin of the memory cell.

It is another object of the present invention to provide a voltage regulator that is able to clamp the row voltage of a memory array at a value which is greater than an unprogrammed threshold voltage level of the memory cell and less than a programmed threshold voltage level of the memory cell.

BRIEF DESCRIPTION OF THE PREFERRED EMBODIMENTS

In accordance with one embodiment of the present invention, a voltage regulator is disclosed which generates a row voltage for a memory cell of a memory array having a value which is greater than an unprogrammed threshold voltage level of the memory cell and less than a programmed threshold voltage level of the memory cell. The voltage regulator uses an unprogrammed memory cell of the memory array for allowing the row voltage outputted by the voltage regulator to be self-tracking with the unprogrammed threshold voltage level of the memory cell over manufacturing process variations and ambient environmental influences. A switching circuit is coupled to the unprogrammed memory cell for clamping the row voltage outputted by the voltage regulator below the programmed threshold voltage level.

In accordance with another embodiment of the present invention, a method of providing a voltage regulator for generating a row voltage for a memory cell of a memory array having a value which is greater than an unprogrammed threshold voltage level of the memory cell and less than a programmed threshold voltage level of the memory cell. The method comprises the steps of: providing an unprogrammed memory cell of the memory array for allowing the row voltage outputted by the voltage regulator to be self-tracking with the unprogrammed threshold voltage level of the memory cell over manufacturing process variations and ambient environmental influences; and providing a switching circuit coupled to the unprogrammed memory cell for clamping the row voltage outputted by the voltage regulator below the programmed threshold voltage level.

The foregoing and other objects, features, and advantages of the invention will be apparent from the following, more

DETAILED DESCRIPTION OF THE PREFERRED EMBODIMENTS

Figure 1:
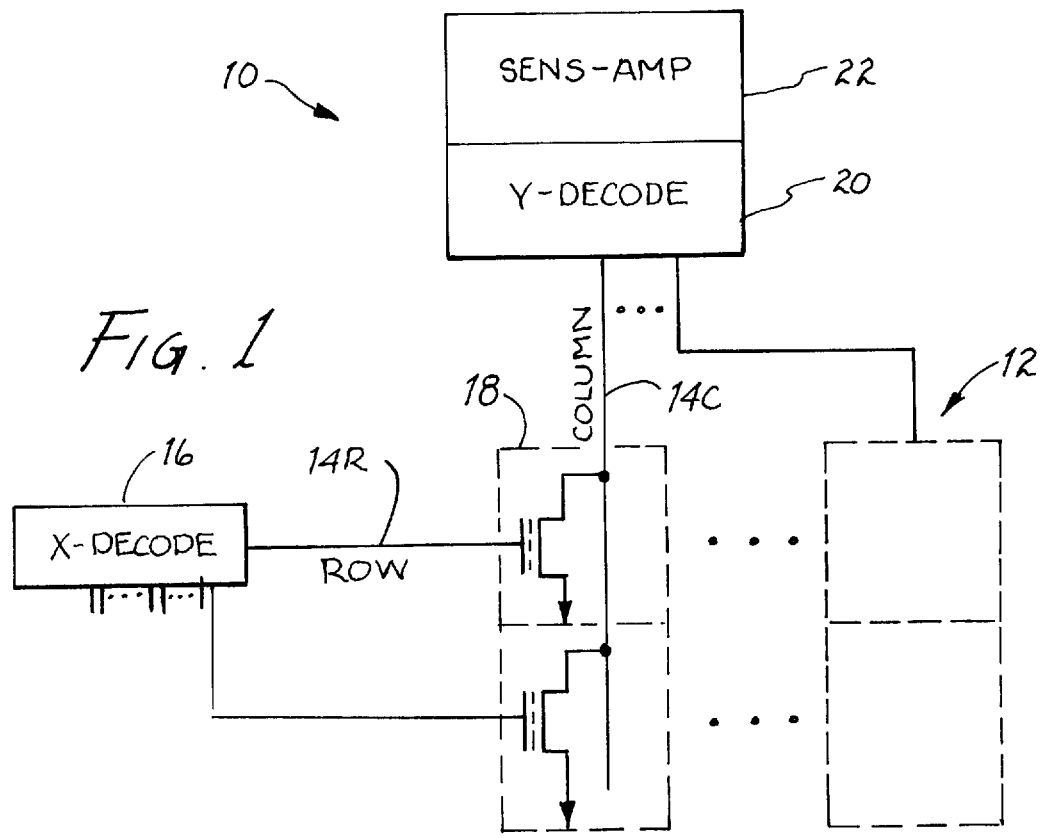
FIG. 1 is a simplified functional block diagram of the architecture used for reading and programming a memory cell of a memory array.

Referring to FIG. 1, a prior art system 10, used to read and write to a memory array 12, is shown. In the embodiment depicted in FIG. 1, a row 14R of the memory array 12 is driven by an x-decoder 16 to drive the gate of a memory cell 18 in the memory array 12, or placed as isolated bits. The column 14C is coupled to the drain of the memory cell 18. In a memory array architecture, a specific column is selected from a number of other memory array columns by the Y-decoder 20. The state of the memory cell (programmed or unprogrammed) is determined by the memory cell current flow. The memory cell current flow is measured in the sense amp 22 which is directly coupled to the Y-decoder 20. In a classic implementation, the row voltage is forced by a row driver (not shown) powered from a semiconductor device power supply. Thus, the row driver generally forces the gate voltage to $V_{DD}$.

Figure 2:
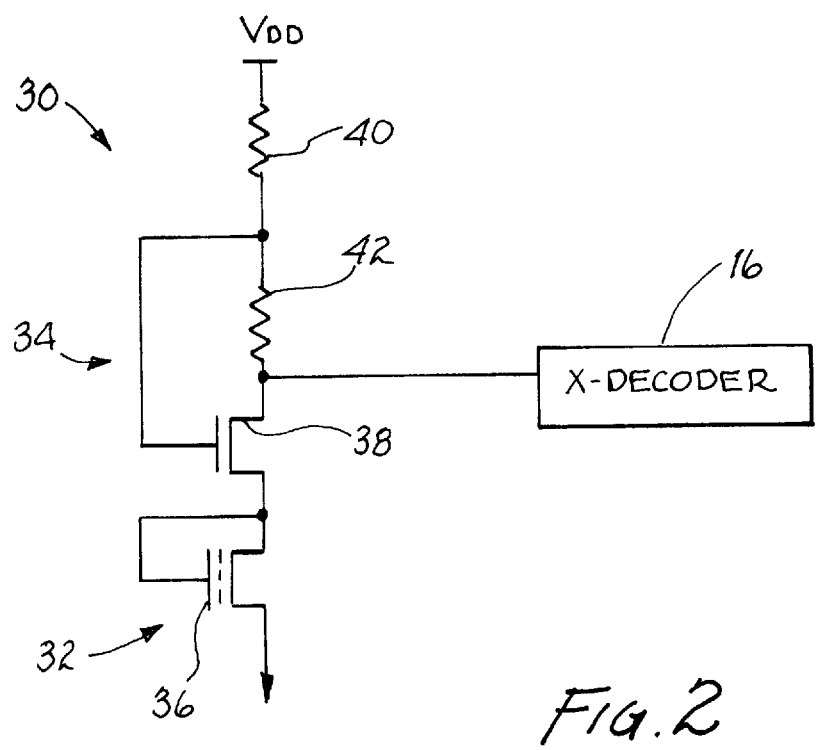
FIG. 2 is a simplified electrical schematic of the voltage regulator of the present invention.

As stated above, the operating voltage for many semiconductor devices being produced on new manufacturing processes are greater than the programming margin of the programmed memory cell. Referring to FIG. 2, wherein like numerals and symbols represent like elements, a voltage regulator 30 is shown. The voltage regulator 30 is used for generating a row voltage for a memory cell 18 (FIG. 1) of a memory array 12 (FIG. 1). The voltage regulator 30 is designed to provide a row voltage which has a value which is greater than an unprogrammed threshold voltage level of the memory cell 18 and less than a programmed threshold voltage level of the memory cell 18.

The voltage regulator 30 is comprised of two main components: an unprogrammed memory cell 32 and a switching circuit 34. The unprogrammed memory cell 32 is an unprogrammed memory cell from the memory array 12 to which the voltage regulator 30 is being used to control. The unprogrammed memory cell 32 is used for allowing the row voltage outputted by the voltage regulator 30 to be self-tracking with the unprogrammed threshold voltage level of unprogrammed memory cells in the memory array 12 over manufacturing process variations and ambient environmental influences. The unprogrammed memory cell 32 acts as a threshold offset. If the unprogrammed threshold voltage of the memory array goes lower, the unprogrammed threshold voltage of the unprogrammed memory cell 32 goes lower. If the unprogrammed threshold voltage of the memory array goes higher, the unprogrammed threshold voltage of the unprogrammed memory cell 32 goes higher. The unprogrammed memory cell 32 guarantees that the row voltage outputted by the voltage regulator 30 will never be lower than the unprogrammed threshold voltage of the memory array 12. This is vital for the voltage regulator 30 because if the row voltage is too low, an unprogrammed memory cell that is being accessed will read as if the memory cell is programmed.

The unprogrammed memory cell 32 generally consist of a transistor 36 having drain, gate, and source terminals. In the preferred embodiment, the transistor 36 is an NMOS transistor. The terminals of the transistor 36 are connected in the following manner. The drain terminal of the transistor 36 is coupled to the switching circuit 34. The gate terminal of the transistor 36 is coupled to the drain terminal of the transistor 36. The source terminal of the transistor 36 is grounded.

The switching circuit 34 is coupled to the unprogrammed memory cell 32. The switching circuit 34 is used for clamping the row voltage outputted by the voltage regulator 30 below the programmed threshold voltage level of a programmed memory cell in the memory array 12. The switching circuit 34 employs a technique of a self-correcting gate bias that helps build a very stable output row voltage over a wide operating voltage range. After a minimum voltage has been reached to activate the switching circuit 34, any further increases will cause the switching circuit 34 to clamp down. This will effectively stop any further increases from being sent to the X-decoder 16 in order to drive the row of the memory array 12.

The switching circuit 34 is comprised of a transistor 38, a first resistor 40, and a second resistor 42. The first resistor 40 has a first terminal which is coupled to a voltage supply $V_{DD}$. The second terminal of the first resistor 40 is coupled to the first terminal of the second resistor 42. The second terminal of the second resistor 42 is coupled to the transistor 38. The transistor 38 has drain, gate, and source terminals. The drain terminal of the transistor 38 is coupled to the second terminal of the second resistor 42 and to the X-decoder 16. The gate terminal of the transistor 38 is coupled to the second terminal of the first resistor 40 and to the first terminal of the second resistor 42. The source terminal of the transistor 38 is coupled to the drain and gate terminals of the transistor 36 of the unprogrammed memory cell 32. In the preferred embodiment of the present invention, the transistor 38 is an NMOS transistor.

When the supply voltage $V_{DD}$ is first turned on, after a minimum voltage has been reached to activate the switching circuit 34, any further increases will cause the gate of the transistor 38 to turn on harder. The harder the transistor 38 is turned on, the more transistor 38 pulls down. This will effectively stop further increases in the voltage supply $V_{DD}$ from being sent to the X-decoder 16 which is used to drive the row of the memory array 12.

The first and second resistors 40 and 42 shape the characteristic of the row voltage outputted by the voltage regulator 30 to the X-decoder 16. The first and second resistors 40 and 42 determine at what ratio the transistor 38 turns on and off as $V_{DD}$ is increased above the erased memory cell threshold voltage. Thus, as $V_{DD}$ is slowly increased, at a voltage level which is greater than an unprogrammed threshold voltage level of the memory cell and less than a programmed threshold voltage level of the memory cell, the voltage regulator 30 will be clamped. Thus, the voltage regulator 30 will output a constant row voltage to the X-decoder 16 having a value which is greater than an unprogrammed threshold voltage level of the memory cell and less than a programmed threshold voltage level of the memory cell. Further increases in the supply voltage $V_{DD}$ will not be outputted to the X-decoder 16.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. A voltage regulator for generating a row voltage for a memory cell of a memory array having a value which is greater than an unprogrammed threshold voltage level of said memory cell and less than a programmed threshold voltage level of said memory cell comprising, in combination:

an unprogrammed memory cell of said memory array for allowing said row voltage outputted by said voltage regulator to be self-tracking with said unprogrammed threshold voltage level of said memory cell of said memory array over manufacturing process variations and ambient environmental influences; and a switching circuit coupled to said unprogrammed memory cell for clamping said row voltage outputted by said voltage regulator below said programmed threshold voltage level.

2. A voltage regulator in accordance with claim 1 wherein said switching circuit has means for self-correcting a gate bias of said switching circuit which allows said switching circuit to stop increases of said row voltage outputted by said voltage regulator once said switching means is activated to a level below said programmed threshold voltage level.

3. A voltage regulator in accordance with claim 2 wherein said switching circuit comprises:

a first resistor having first and second terminals wherein said first terminal of said first resistor is coupled to a voltage supply source;

a second resistor having first and second terminals wherein said first terminal of said second resistor is coupled to said second terminal of said first resistor and said second terminal of said second resistor is coupled to a row decoder to drive said row voltage of said memory cell; and a transistor having drain, gate, and source terminals wherein said drain terminal is coupled to said second terminal of said second resistor and to said row decoder, said gate terminal of said transistor is coupled to said second terminal of said first resistor and said first terminal of said second resistor, and said source terminal of said transistor is coupled to said unprogrammed memory cell of said memory array.

4. A voltage regulator in accordance with claim 3 wherein said transistor is an NMOS transistor.

5. A voltage regulator in accordance with claim 3 wherein said first resistor and said second resistor determine at what ratio said transistor turns on and off as a value of said voltage supply source increases above said programmed threshold voltage.

6. A voltage regulator in accordance with claim 1 wherein said unprogrammed memory cell has a transistor having drain, gate, and source terminals wherein said drain terminal is coupled to said switching circuit, said gate terminal is coupled to said drain terminal, and said source terminal is coupled to ground.

7. A voltage regulator in accordance with claim 6 wherein said transistor of said unprogrammed memory cell is an NMOS transistor.

8. A voltage regulator for generating a row voltage for a memory cell of a memory array having a value which is greater than an unprogrammed threshold voltage level of said memory cell and less than a programmed threshold voltage level of said memory cell comprising, in combination:

an unprogrammed memory cell of said memory array for allowing said row voltage outputted by said voltage regulator to be self-tracking with said unprogrammed threshold voltage level of said memory cell of said memory array over manufacturing process variations and ambient environmental influences; and a switching circuit coupled to said unprogrammed memory cell for clamping said row voltage outputted by said voltage regulator below said programmed threshold voltage level and having means for self-correcting a gate bias of said switching circuit which allows said switching circuit to stop increases of said row voltage outputted by said voltage regulator once said switching means is activated to a level below said programmed threshold voltage level, said switching circuit comprising:

a first resistor having first and second terminals wherein said first terminal of said first resistor is coupled to a voltage supply source;

a second resistor having first and second terminals wherein said first terminal of said second resistor is coupled to said second terminal of said first resistor and said second terminal of said second resistor is coupled to a row decoder to drive said row voltage of said memory cell; and a transistor having drain, gate, and source terminals wherein said drain terminal is coupled to said second terminal of said second resistor and to said row decoder, said gate terminal of said transistor is coupled to said second terminal of said first resistor and said first terminal of said second resistor, and said source terminal of said transistor is coupled to said unprogrammed memory cell of said memory array.

9. A voltage regulator in accordance with claim 8 wherein said transistor is an NMOS transistor.

10. A voltage regulator in accordance with claim 8 wherein said first resistor and said second resistor determine at what ratio said transistor turns on and off as a value of said voltage supply source increases above said programmed threshold voltage.

11. A voltage regulator in accordance with claim 7 wherein said unprogrammed memory cell has a transistor having drain, gate, and source terminals wherein said drain terminal is coupled to said switching circuit, said gate terminal is coupled to said drain terminal, and said source terminal is coupled to ground.

12. A voltage regulator in accordance with claim 11 wherein said transistor of said unprogrammed memory cell is an NMOS transistor.

13. A method of providing a voltage regulator for generating a row voltage for a memory cell of a memory array having a value which is greater than an unprogrammed threshold voltage level of said memory cell and less than a programmed threshold voltage level of said memory cell comprising the steps of:

providing an unprogrammed memory cell of said memory array for allowing said row voltage outputted by said voltage regulator to be self-tracking with said unprogrammed threshold voltage level of said memory cell of said memory array over manufacturing process variations and ambient environmental influences; and providing a switching circuit coupled to said unprogrammed memory cell for clamping said row voltage outputted by said voltage regulator below said programmed threshold voltage level.

14. The method of claim 13 wherein said step of providing said switching circuit further comprises the step of providing said switching circuit having means for self-correcting a gate bias of said switching circuit which allows said switching circuit to stop increases of said row voltage outputted by said voltage regulator once said switching means is activated to a level below said programmed threshold voltage level.

15. The method of claim 14 wherein said step of providing said switching circuit further comprises the steps of:

provingding a first resistor having first and second terminals wherein said first terminal of said first resistor is coupled to a voltage supply source;

providing a second resistor having first and second terminals wherein said first terminal of said second resistor is coupled to said second terminal of said first resistor and said second terminal of said second resistor is coupled to a row decoder to drive said row voltage of said memory cell; and providing a transistor having drain, gate, and source terminals wherein said drain terminal is coupled to said second terminal of said second resistor and to said row decoder, said gate terminal of said transistor is coupled to said second terminal of said first resistor and said first terminal of said second resistor, and said source terminal of said transistor is coupled to said unprogrammed memory cell of said memory array.

16. The method of claim 15 wherein said step of providing said transistor further comprises the step of providing an NMOS transistor.

17. The method of claim 15 further comprising the step of providing said first resistor and said second resistor to determine at what ratio said transistor turns on and off as a value of said voltage supply source increases above said programmed threshold voltage.

18. The method of claim 13 wherein said step of providing said unprogrammed memory cell further comprises the step of providing a transistor having drain, gate, and source terminals wherein said drain terminal is coupled to said switching circuit, said gate terminal is coupled to said drain terminal, and said source terminal is coupled to ground.

19. The method of claim 18 wherein said step of providing said transistor further comprises the step of providing an NMOS transistor.

* * * * *